(12) United States Patent
Eqbal et al.

(10) Patent No.: US 12,476,632 B2
(45) Date of Patent: Nov. 18, 2025

(54) TEMPERATURE-ADAPTIVE GATE DRIVER FOR GAN SWITCH

(71) Applicant: Tagore Technology, Inc., Arlington Heights, IL (US)

(72) Inventors: Syed Asif Eqbal, Bihar (IN); Arnesh Sen, Howrah (IN)

(*) Notice: Subject to any disclaimer, the term of this patent is extended or adjusted under 35 U.S.C. 154(b) by 104 days.

(21) Appl. No.: 18/488,114

(22) Filed: Oct. 17, 2023

(65) Prior Publication Data

US 2025/0125798 A1    Apr. 17, 2025

(51) Int. Cl.
*H03K 17/00*    (2006.01)
*H03K 17/14*    (2006.01)

(52) U.S. Cl.
CPC ... *H03K 17/145* (2013.01); *H03K 2217/0081* (2013.01)

(58) Field of Classification Search
CPC ............... H03K 17/145; H03K 17/687; H03K 2217/0081
See application file for complete search history.

(56) References Cited

U.S. PATENT DOCUMENTS

| | | | |
|---|---|---|---|
| 11,545,418 B2 * | 1/2023 | Chauhan | H01L 21/50 |
| 12,143,099 B2 * | 11/2024 | Okuyama | H03K 17/04206 |
| 2020/0350904 A1 * | 11/2020 | Melkonyan | H03K 17/08122 |
| 2022/0065924 A1 * | 3/2022 | Barrenscheen | H03K 17/18 |
| 2022/0360259 A1 | 11/2022 | Hou et al. | |
| 2022/0381814 A1 * | 12/2022 | Majima | H03K 17/687 |
| 2023/0208274 A1 * | 6/2023 | Sakai | H03K 17/168 |
| 2024/0048139 A1 * | 2/2024 | Takahashi | H03K 19/00361 |

OTHER PUBLICATIONS

Kao, et al., "Fully Integrated GaN-on-Silicon Gate Driver and GaN Switch With Temperature-Compensated Fast Turn-on Technique for Achieving Switching Frequency of 50 MHz and Slew Rate of 118.3 V/Ns", IEEE Journal of Solid-State Circuits, Dec. 2021, pp. 3619-3627, vol. 56, No. 12, IEEE, US.

* cited by examiner

*Primary Examiner* — Tuan T Lam
(74) *Attorney, Agent, or Firm* — Fleit Intellectual Property Law; Jon Gibbons

(57) ABSTRACT

A temperature-adaptive gate driver for a GaN switch includes a gate-to-source voltage adjustment unit and a driver for outputting an on-state gate-to-source voltage to a gate terminal of the switch. The on-state gate-to-source voltage is adjusted based, in part, on temperature of the switch. The amount of adjustment of the on-state gate-to-source voltage with rise in temperature is based, in part, on high-temperature gate-bias reliability data of the switch and is chosen for a favorable trade-off between performance and life-time. The gate-to-source voltage adjustment unit includes a temperature sense element for sensing temperature of the switch and outputs to the driver an output signal based, in part, on temperature. The gate-to-source voltage adjustment unit includes a regulator for receiving a feedback signal based in part, on resistance of the temperature sense element, and for causing a value of the output signal to be responsive to a value of the feedback signal.

19 Claims, 15 Drawing Sheets

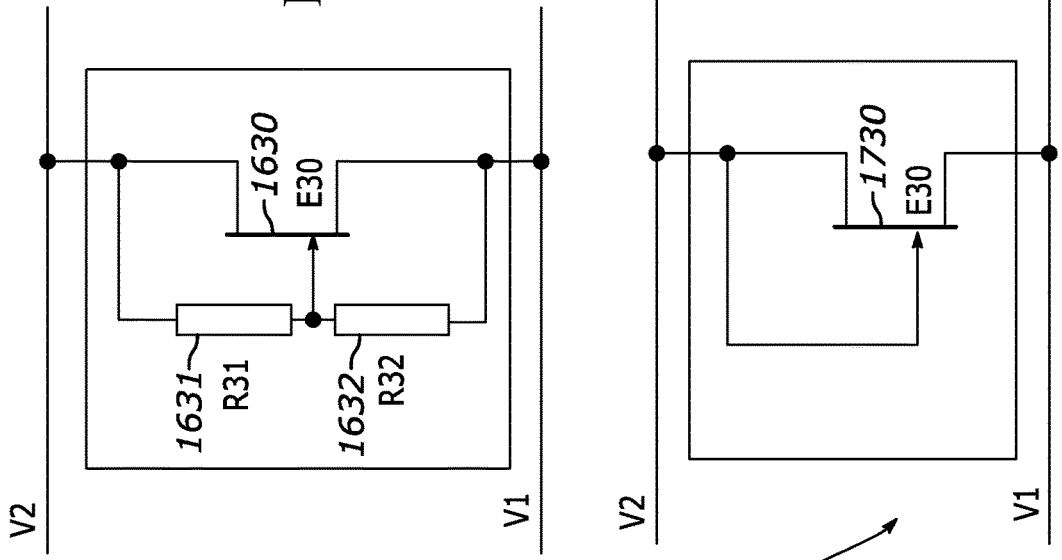
FIG. 16
FIG. 17
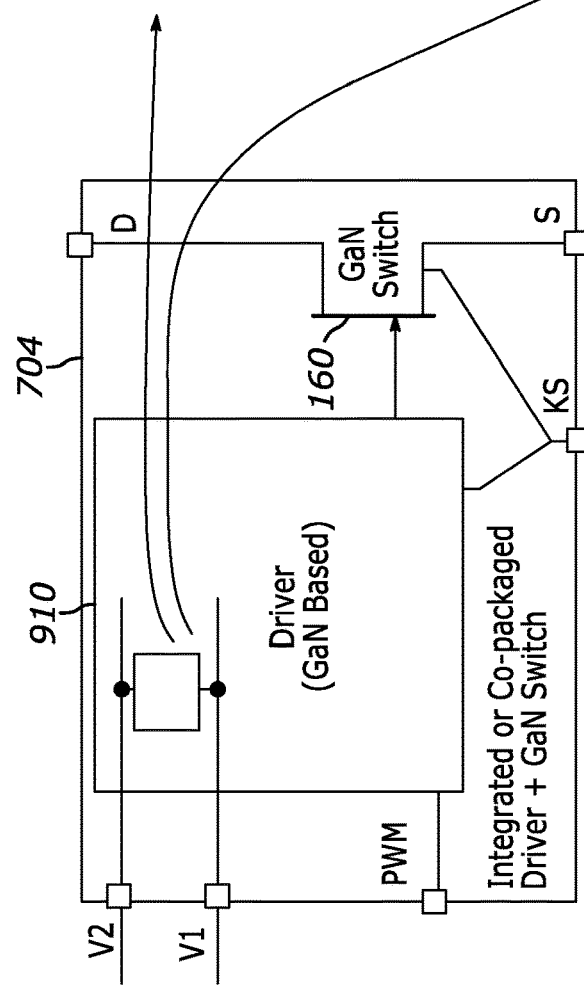
FIG. 15

TEMPERATURE-ADAPTIVE GATE DRIVER FOR GAN SWITCH

BACKGROUND

Field

This invention relates generally to active solid-state devices, and more specifically to a gate drive circuit for a gallium nitride power field-effect transistor.

Related Art

A gallium nitride (hereinafter "GaN") device provides benefits of high switching speeds and low switching losses for a given breakdown voltage and switch size. These characteristics are beneficial in a number of applications ranging from power electronics converters to audio amplifiers to LiDAR.

When used as a switching device, the benefit of a high switching speed is more fully realized only when a GaN device is made capable of operating at a high speed of operation. If a semiconductor power switch and its driver are not on a same die, then parasitic elements, such as die-to-die or die-to-package inductances and capacitances limit the speed of operation. Therefore, if a GaN semiconductor power switch and its GaN driver are made on the same die, i.e., both are fabricated in a GaN process, then potentially much better speed of operation and performance can be achieved.

At the present state of the art, commercially available GaN process produces only N-type of devices, and complementary P-types are not available. Therefore, complementary metal oxide semiconductor (hereinafter "CMOS") type of designs, which rely heavily on complementary devices, are not possible for circuits fabricated in a GaN process. A lack of complementary devices greatly limits choice and performance of circuits in GaN technology.

The behavior of GaN devices is not exactly the same as the behavior of more traditional silicon devices. In general, process variations are higher in GaN processes than in more traditional silicon semiconductor processes. For example, the threshold voltage of a GaN device changes by a much larger amount due to process variations than does the threshold voltage of a CMOS device due to process variations. The threshold voltage of a GaN high-electron-mobility transistor (hereinafter "HEMT") may vary, for example, from 0.5V to 2.2V depending upon the manufacturing process. However, the threshold voltage of all GaN HEMTs in a die is within a reasonable range.

GaN wafers are relatively costly as compared to silicon, and, as device minimum sizes are still quite large, packaging densities are low. This means that only simple circuits with a limited number of components can be packed within a die in a cost-effective manner.

A GaN HEMT is an enhancement-mode device that may be used as a switch. An enhancement-mode HEMT is normally off when its gate-to-source voltage is 0V. An enhancement-mode HEMT turns off when its gate-to-source voltage is less than its threshold voltage or when its gate terminal is biased around zero volts or at a negative voltage with respect to its source terminal.

GaN is a semiconductor process technology that has much better figure-of-merit (FoM=$R_{DS(on)}*Q_G$, where $R_{DS(on)}$ is the drain-to-source on-state resistance and $Q_G$ is gate charge) over existing silicon process technology. Due to its superior FoM, a GaN-based power converter is operated at high switching frequency to extract its full potential of achieving high power density.

BRIEF DESCRIPTION OF THE DRAWINGS

The present invention is illustrated by way of example and is not limited by the accompanying figures, in which like references indicate similar elements. Elements in the figures illustrated for simplicity and clarity and have not necessarily been drawn to scale.

FIGS. 15, 16 and 17 illustrate of how $V_1$ can be fed from $V_2$ in the embodiments of a temperature-adaptive gate driver shown in FIGS. 7-13.

DETAILED DESCRIPTION

A temperature-adaptive driver for a GaN switch in accordance with the invention improves performance of a GaN switch to which it is coupled.

Enhancement-mode gallium-nitride (e-mode GaN) semiconductor devices find widespread use as power switches in power converters. These switches turn on when a sufficiently high voltage is applied across the gate-to-source terminals and turn-off when this voltage is made close to zero or negative. The gate-to-source voltage ($V_{GS}$) is applied through a driver. Typically, a driver has a positive rail to which the gate voltage rises and stays during the on-state, and the corresponding $V_{GS}$ can be called $V_{GS(on)}$. Similarly, the driver has a negative rail to which the gate voltage falls and stays during the off-state, and the corresponding $V_{GS}$ can be called $V_{GS(off)}$. For an e-mode GaN semiconductor device, a typical value of $V_{GS(on)}$ is 6V, and a typical value of $V_{GS(off)}$ is 0V.

Figure 1:
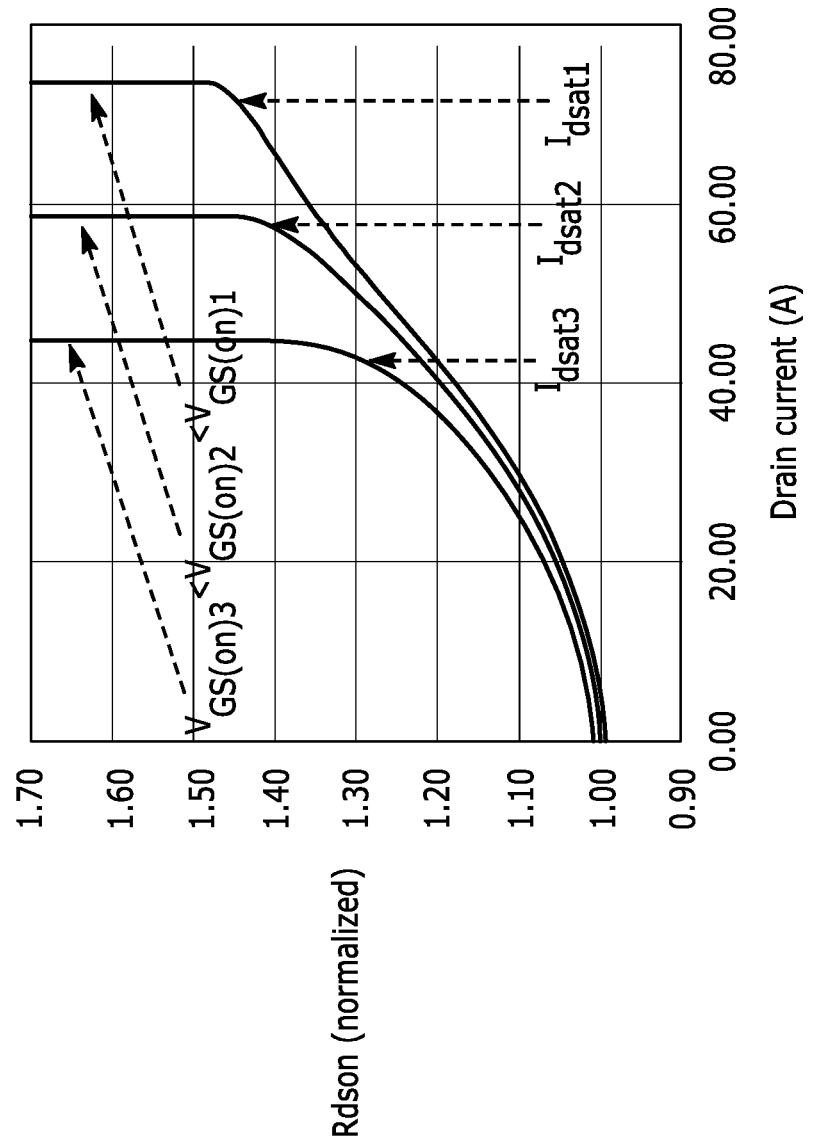
FIG. 1 is a graph of $R_{DS(on)}$ variation with the drain current for various values of $V_{GS(on)}$.

Two of the key performance metrics of such switches are on-state drain-to-source resistance $R_{DS(on)}$ and saturation current $I_{Dsat}$. For a given switch, a lower $R_{DS(on)}$ is preferable as it decreases losses in a power converter. Lower losses lead to benefits such as energy saving, reduced burden on a cooling system, improved reliability, and a lower overall cost. $I_{Dsat}$ is closely related to load handling capability. For a given switch, an $I_{Dsat}$ rating higher than a maximum on-state current requirement is a must as otherwise the switch leaves ohmic region of operation and enters saturation region. This condition leads to an excessively high voltage across the switch, which in turn may disrupt the functioning of the power converter or may even damage it. These two performance metrics are directly governed by the on-state gate-to-source voltage $V_{GS(on)}$ of the switch. In general, a lower $V_{GS(on)}$ leads to a higher $R_{DS(on)}$ and a lower $I_{Dsat}$, and increasing $V_{GS(on)}$ allows both of these metrics to improve. A typical representation of this behavior is shown in FIG. 1.

Figure 2:
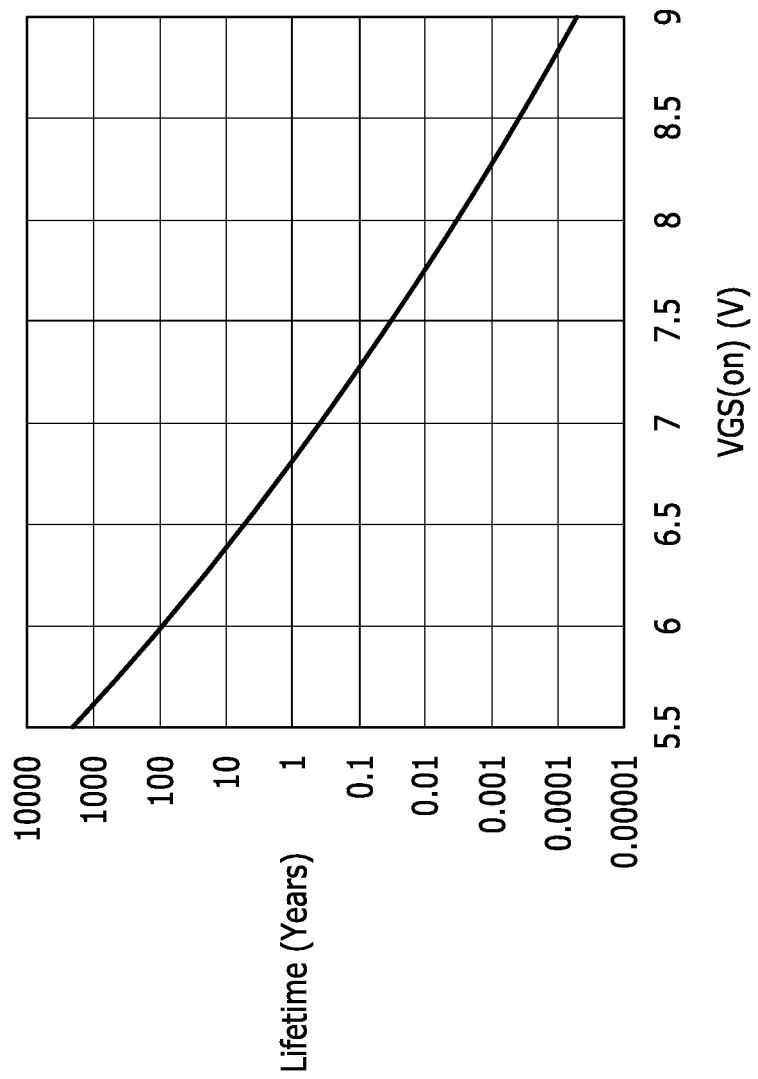
FIG. 2 is a graph of HTGB lifetime as a function of $V_{GS(on)}$ at 25° C.

A maximum employable $V_{GS(on)}$ is set by device technology and material properties. Using a $V_{GS(on)}$ higher than the technology-determined limit degrades the operable lifetime of the device. This is shown by way of example in FIG. 2 which shows as $V_{GS(on)}$ changes from 6V to 6.8V, an operable lifetime comes down from about 95 years to about 1.1 years. A common way for describing the useful lifetime of a switch is through reliability such as high-temperature gate-bias (HTGB) reliability. The HTGB reliability falls at a steep rate as $V_{GS(on)}$ increases. Therefore, for GaN semiconductor technology, there is an inherent trade-off between performance related demand on $V_{GS(on)}$ and reliability related demand, and for a given GaN semiconductor process, an optimum $V_{GS(on)}$ provides a right trade-off between the aforementioned demands.

Figure 3:
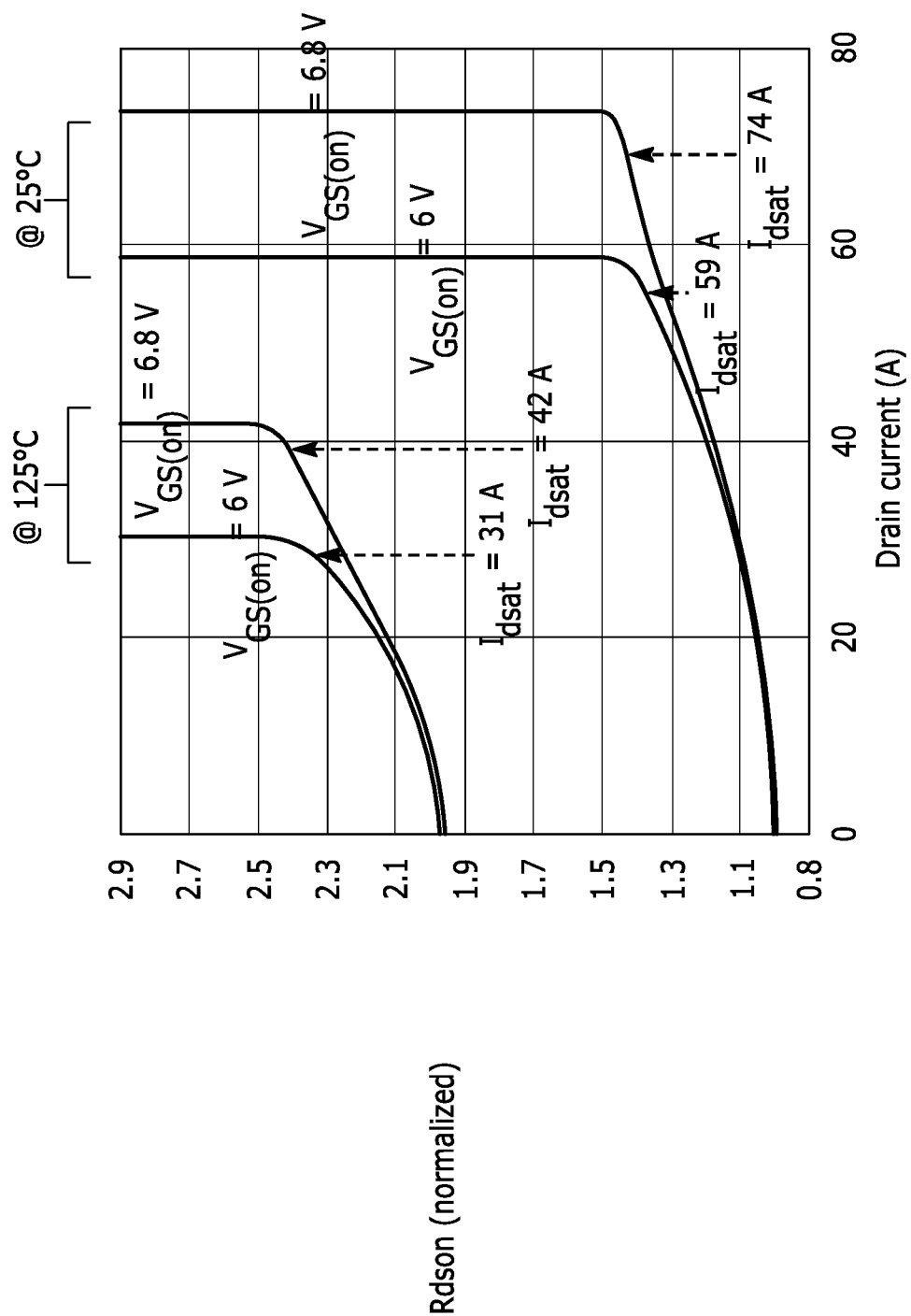
FIG. 3 is a graph of $R_{DS(on)}$ variation with the drain current for various values of $V_{GS(on)}$ at two different temperatures.

Another consideration regarding tradeoff is effect of temperature. The performance of a GaN semiconductor device, both in terms of $R_{DS(on)}$ and $I_{Dsat}$, is strongly affected by change in temperature. As the temperature rises, $R_{DS(on)}$ rises and $I_{Dsat}$ falls. This is shown in FIG. 3, where large change in device characteristics is observed as the temperature changes from 25° C. to 125° C. A higher $V_{GS(on)}$ provides a lower $R_{DS(on)}$ and a higher $I_{Dsat}$. However, at a higher temperature, for a same change in $V_{GS(on)}$, percentage change in $I_{Dsat}$ is higher. Therefore, at 25° C., an increase in $V_{GS(on)}$ from 6V to 6.8V produces an improvement in $I_{Dsat}$ of about 25%; whereas at 125° C., an increase in $V_{GS(on)}$ from 6V to 6.8V produces an improvement in $I_{Dsat}$ of about 35%.

Therefore, a sufficient $V_{GS(on)}$ for supporting good performance is even more important at a high temperature than at room temperature. Most converters under normal working conditions experience elevated temperatures because some of the power they handle is converted into heat. This heat then raises the temperature of the semiconductor switch, and it is common to observe switch temperature in the range of 100° C. to 130° C. under operation.

Figure 4:
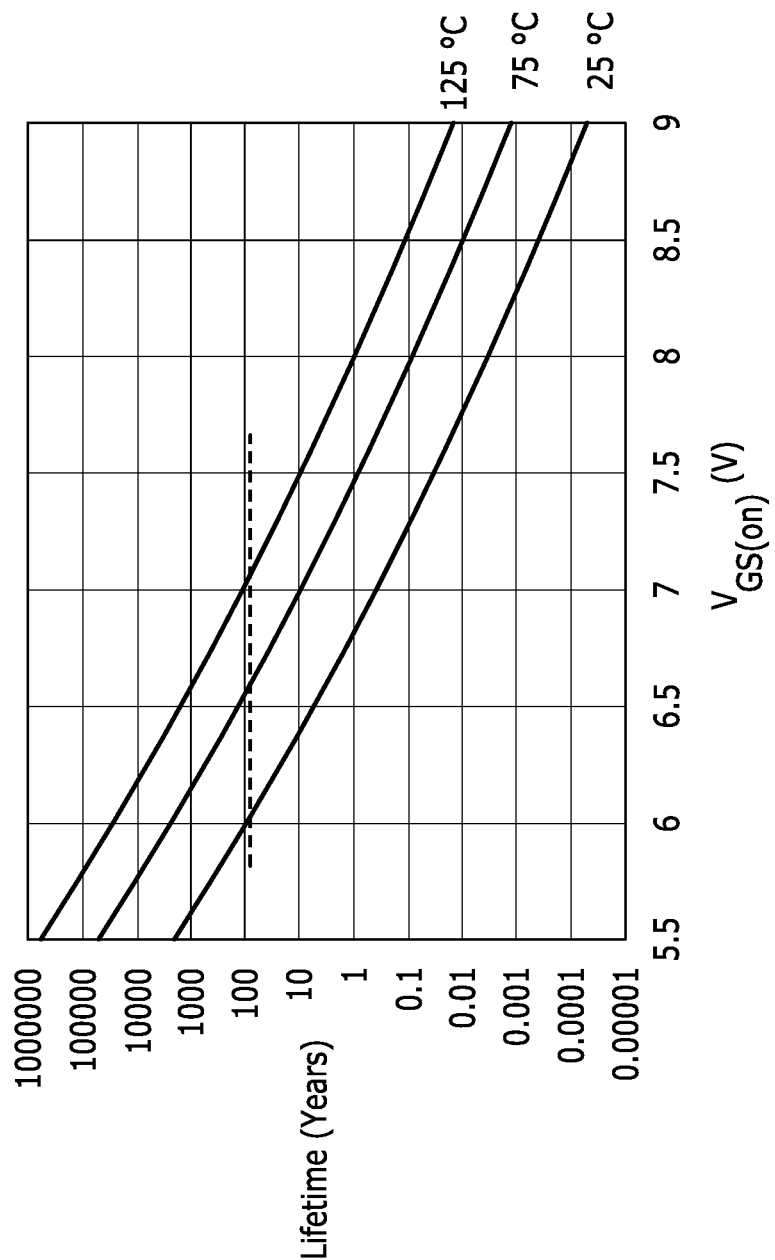
FIG. 4 is a graph of HTGB lifetime as a function of $V_{GS(on)}$ at three different values of temperature.

Gate reliability of a GaN device is also affected by the temperature of the GaN device. A typical relationship is shown in FIG. 4. In general, from room temperature and above, as the temperature goes higher, the gate reliability improves. In other words, at a higher temperature, a GaN device can sustain a higher $V_{GS(on)}$ voltage without suffering from an excessive drop in its operable lifetime. This observation together with the effect of temperature can be utilized to devise a scheme where the on-state gate-to-source voltage $V_{GS(on)}$ is made to rise with rise in temperature in a predetermined fashion. This scheme provides benefits in terms of better values of $R_{DS(on)}$ and $I_{Dsat}$ without compromising the gate reliability. This is a basis for the temperature-adaptive gate driver a GaN switch, in accordance with the invention.

Overall, the temperature-adaptive gate driver in accordance with the invention taps into the extra available HTGB reliability margin at higher temperatures and compensates for a loss in the switch performance at higher temperature by increasing the on-state gate-to-source voltage without compromising the gate reliability.

A GaN switch is implemented as discrete GaN device or as an integrated GaN device, and either case, the e-GaN switch is driven using a driver. The temperature-adaptive gate driver in accordance with the invention adaptively adjusts the on-state gate-to-source voltage $V_{GS(on)}$ based on temperature of the GaN switch.

An amount of adjustment in $V_{GS(on)}$ with rise in temperature is determined based on HTGB reliability data of a particular GaN technology.

The temperature-adaptive gate driver includes a gate-to-source voltage adjustment unit (hereinafter "$V_{GS(on)}$ adjustment unit"). The $V_{GS(on)}$ adjustment unit further includes a temperature sense element. These two elements are in addition to the usual components of a driver which usually includes a series of buffer stages with increasing drive capacity and may include some other circuitry. The $V_{GS(on)}$ adjustment unit can be implemented in any one of the following forms or a combination thereof: a gallium nitride (GaN) integrated circuit (IC); a separate semiconductor IC in silicon or some other suitable material; and a board-level solution utilizing a combination of discrete components and ICs.

With respect to the driven GaN switch, the $V_{GS(on)}$ adjustment unit can be implemented in any combination of same-die integration, co-packaged but different dies, or completely separate solutions at the board level. Some example cases, not to be construed as limiting, are provided below:

The temperature sense element, the $V_{GS(on)}$ adjustment unit and the GaN switch can be implemented on a same GaN IC.

The temperature sense element and the $V_{GS(on)}$ adjustment unit can be implemented on a separate silicon-based IC, but co-packaged with a GaN switch within a same power-module.

The temperature sense element and the GaN power switch can be implemented on the same GaN IC, but the $V_{GS(on)}$ adjustment unit on a separate board-level solution.

The temperature sense element and the GaN power switch on the same GaN IC, but the $V_{GS(on)}$ adjustment unit on a separate silicon-based IC, and all co-packaged within a same microelectronic package.

Another implementation is as follows: a board-level temperature sense element, a separate GaN power switch, and the $V_{GS(on)}$ adjustment unit on a separate silicon-based IC.

The temperature sense element uses a temperature sensitive device as described below.

At a discrete level, temperature-sensitive resistors are widely available with a negative or a positive temperature coefficient, which can serve the purpose of temperature sensing. The embodiments shown in FIGS. 5-8 make use of such temperature-sensitive resistors.

Within a silicon integrated device, two ways of sensing temperature are a p-n junction diode drop of a p-n junction diode under forward bias, and a base-emitter voltage of a bipolar-junction transistor under forward bias, both of which show a negative temperature coefficient. Another method of temperature sensing is by sending a proportional-to-absolute-temperature (PTAT) current to a resistor, and by reading the voltage of this resistor. The PTAT current is generated using a bandgap reference. The tenth embodiment of the temperature-adaptive gate driver, shown in FIG. 14, uses a bandgap reference.

In an integrated GaN solution, the threshold voltage of a GaN device shows positive temperature coefficient. Therefore, a small-sense GaN device can be put within the same die as the GaN power switch, and the threshold voltage of the sense GaN device can be monitored for temperature sensing, as shown in FIGS. 9 through 13.

For the implementation of the $V_{GS(on)}$ adjustment unit, a regulator with feedback is used. The sensed temperature information is available in the form of a voltage signal which is appropriately fed back in a regulation loop to achieve a desired adaptation of $V_{GS(on)}$. Embodiments shown in FIGS. 5-8 and 10-13 use regulators that are external to an IC. The embodiment shown in FIG. 9 uses a regulator that is within a GaN IC. The embodiment shown in FIG. 14 uses a slightly different technique where the reference voltage of the internal regulator is made temperature dependent.

Figure 5:
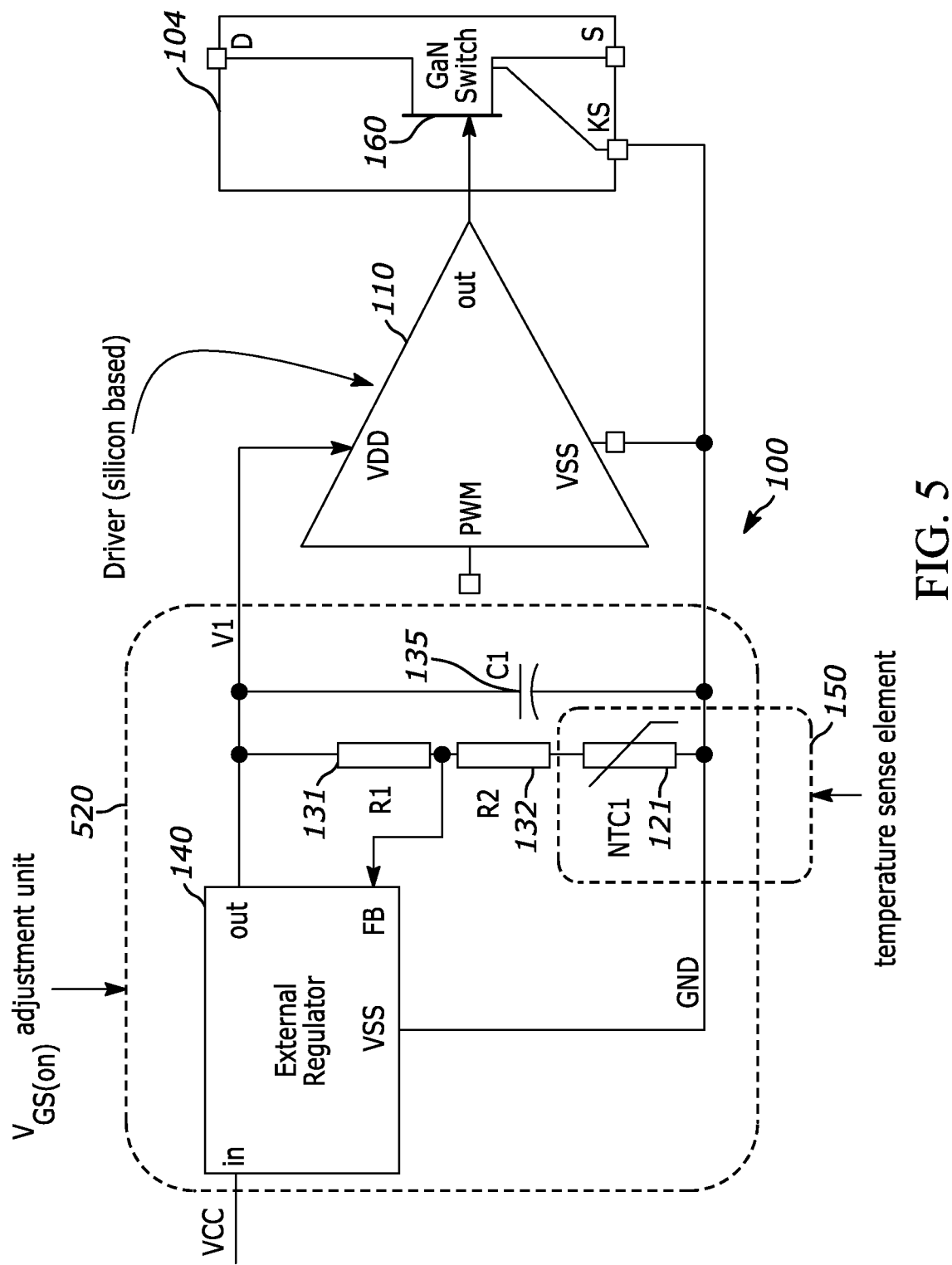
FIG. 5 is a simplified schematic of a first embodiment of a temperature-adaptive gate driver in accordance with the invention.

FIG. 5 is a simplified schematic of a first embodiment of a temperature-adaptive gate driver 100 in accordance with the invention. The temperature-adaptive gate driver 100 comprises a driver 110 having a $V_{DD}$ terminal coupled to a $V_1$ voltage rail, a $V_{SS}$ terminal coupled to ground, a terminal for receiving a pulse width modulated (PWM) signal and an output terminal. In the first embodiment of a temperature-adaptive gate driver 100 the driver 110 is silicon based. The temperature-adaptive gate driver 100 further comprises a $V_{GS(on)}$ adjustment unit 520 that generates a value of the voltage rail $V_1$. The $V_{GS(on)}$ adjustment unit 520 is implemented using discrete components. The $V_{GS(on)}$ adjustment unit 520 includes a resistor network consisting of a negative temperature coefficient thermistor NTC1 121, a resistor R1 131 and a resistor R2 132 coupled in series. The temperature-adaptive gate driver 100 further comprises a regulator 140. The regulator 140 has first terminal coupled to $V_{CC}$, a second terminal coupled to ground, a feedback (FB) terminal coupled to a node between resistor R1 121 and resistor R2 122, and an output terminal. NTC1 121 at one end of the resistor network is coupled to ground and resistor R1 131 at the other end of the resistor network is coupled to the output terminal of the regulator 140. A resistance of NTC1 121 falls with rise in temperature. The NTC1 121 acts as a temperature sense element 150. In other embodiments (not shown) NTC1 121 is a silicon diode or the base-emitter voltage of a silicon bipolar junction transistor (BJT). The temperature-adaptive gate driver 100 also includes a capacitor C1 135 coupled between the output terminal of the regulator 140 and ground. Capacitor C1 135 acts as a de-coupling capacitor for the driver 110 between the voltage rail $V_1$ and ground. Capacitor C1 135 absorbs or provides a transient current as may be demanded by the driver 110 from the regulator 140.

The output terminal of the driver 110 is coupled to a gate terminal of a GaN switch 160 disposed on a GaN die 104. The $V_1$ voltage rail sets a drive voltage of the GaN switch 160 through the driver 110.

For best performance, NTC1 121 is placed in close proximity to the GaN switch 160 so that the temperature of NTC1 121 is a close reflection of the temperature of the GaN switch.

The resistor network consisting of R1 131, R2 132 and NTC1 121 completes a feedback loop of the regulator 140. The resistor R2 132 is optional which may be added to lower effective temperature coefficient of the temperature-adaptive gate driver 100 if NTC1 121 by itself has too high a temperature coefficient.

As temperature of the GaN switch 160 rises, resistance of NTC1 121 falls, and the closed loop control of the regulator 140 forces the value of $V_1$ to rise, which, in turn, increases the value of the drive voltage to the gate of the GaN switch, thereby achieving the objective of the first embodiment of the temperature-adaptive gate driver 100. The temperature coefficient of the NTC1 121 and/or its nominal resistance is chosen for the desirable rate of voltage rise with respect to the change in temperature. All circuit elements in FIG. 5 could be in their separate packages or could be co-packaged at varying levels.

Figure 6:
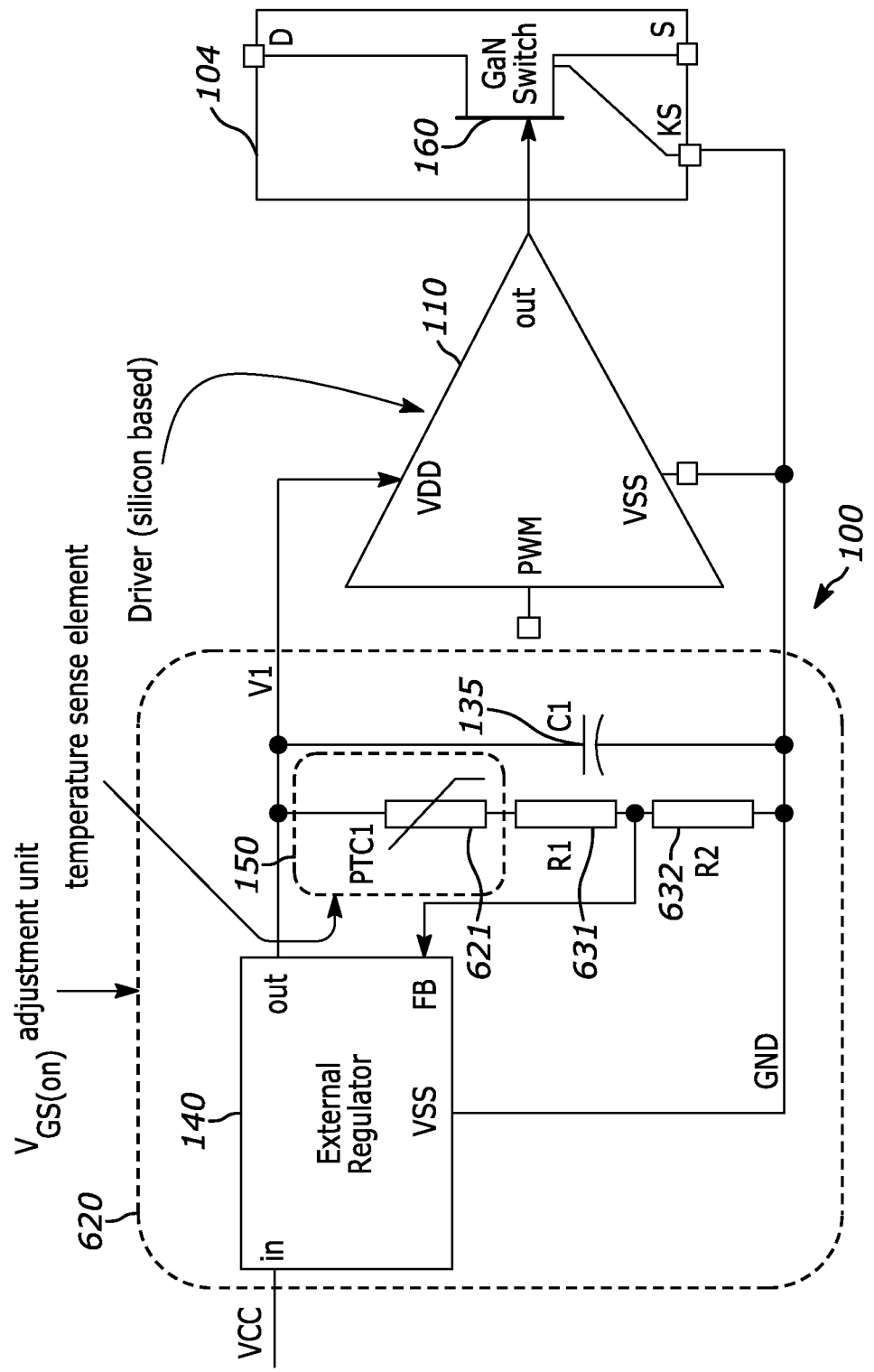
FIG. 6 is a simplified schematic of a second embodiment of a temperature-adaptive gate driver in accordance with the invention.

FIG. 6 is a simplified schematic of a second embodiment of the temperature-adaptive gate driver 100 in accordance with the invention. The second embodiment is similar to the first embodiment with the following differences. For temperature sensing, instead of using the negative temperature coefficient device NTC1 121, a positive temperature coefficient device PTC1 621 is used. The PTC1 621 acts as the temperature sense element 150. The second embodiment of the temperature-adaptive gate driver 100 comprises a $V_{GS(on)}$ adjustment unit 620 that generates a value of the voltage rail $V_1$. The $V_{GS(on)}$ adjustment unit 620 is implemented using discrete components. The $V_{GS(on)}$ adjustment unit 620 includes a resistor network consisting of PTC1 621, a resistor R1 631 and a resistor R2 632 coupled in series. PTC1 621 at one end of the resistor network is coupled to the output terminal of the regulator 140 and resistor R2 622 at the other end of the resistor network is coupled to ground.

In the feedback divider network of resistors, PTC1 621 is placed in the upper half as shown in FIG. 6. Use of resistor R1 631 is optional which may be added to lower the effective temperature coefficient of the temperature-adaptive gate driver 100 if PTC1 621 by itself has too high a temperature coefficient. For best performance, PTC1 621 is placed in close proximity of the GaN switch 160 so that it may reflect the temperature of the GaN switch. As the temperature of the GaN switch 160 rises, resistance of PTC1 621 rises, and the closed loop control of the regulator 140 forces the value of $V_1$ to rise, thereby achieving the objective of the temperature-adaptive gate driver 100. The temperature coefficient of the PTC1 621 and/or its nominal resistance is chosen for the desirable rate of voltage rise with respect to the change in temperature.

Figure 7:
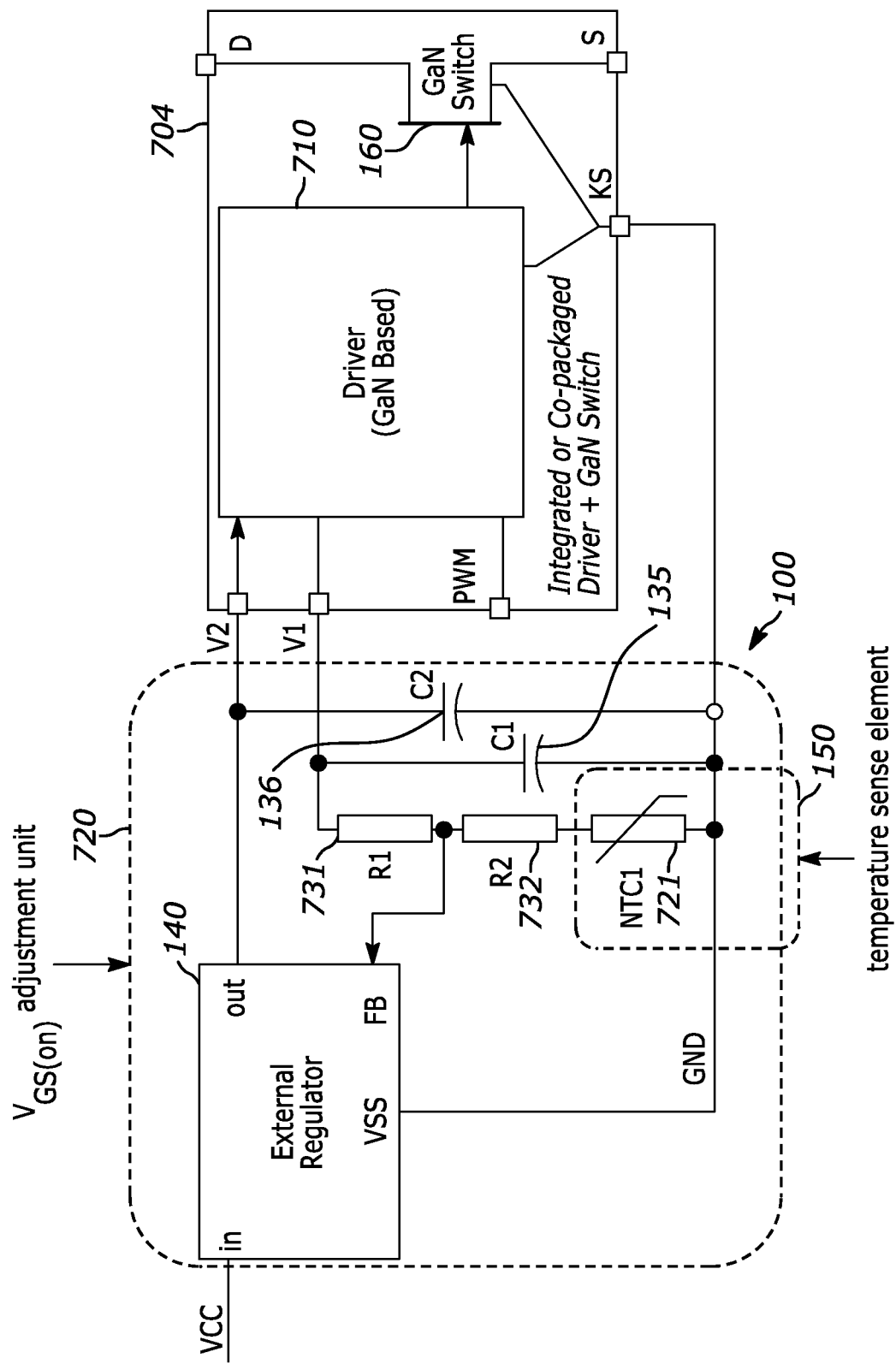
FIG. 7 is a simplified schematic of a third embodiment of a temperature-adaptive gate driver in accordance with the invention.

FIG. 7 is a simplified schematic of a third embodiment of the temperature-adaptive gate driver 100 in accordance with the invention. The third embodiment of the temperature-adaptive gate driver 100 comprises a GaN driver 710 having a first input terminal coupled to a $V_1$ voltage rail, a second input terminal coupled to a $V_2$ voltage rail, a third input terminal for receiving a PWM signal, a fourth input terminal coupled to ground, and an output terminal. In the third embodiment, the GaN driver 710 is co-packaged with the GaN switch 160 in a same microelectronic package 702. Alternatively, GaN driver 710 is integrated with the GaN switch 160 on a same GaN substrate 704. The third embodiment of the temperature-adaptive gate driver 100 comprises a $V_{GS(on)}$ adjustment unit 720 that generates a value of the voltage rail $V_2$. The $V_{GS(on)}$ adjustment unit 720 is implemented using discrete components. The $V_1$ voltage rail sets the drive voltage of the GaN switch 160. NTC1 721 is a negative temperature coefficient device at the board level, whose resistance falls with rise in temperature. The NTC1 721 acts as the temperature sense element 150. Capacitor C1 135 acts as a de-coupling capacitor between the voltage rail $V_1$ and ground, and C2 136 acts as a decoupling capacitor between the voltage rail $V_2$ and ground. NTC1 721 is placed in close proximity to the microelectronic package 702 or placed in close proximity to the GaN substrate 704 so that the temperature of NTC1 721 is a close reflection of the temperature of the GaN switch 160.

Because in GaN-type semiconductor process, p-type devices are usually not available, in order to allow voltage rail $V_1$ to set the drive voltage of the GaN switch 160, the higher voltage rail $V_2$ is needed. The higher voltage rail $V_2$ allows the pull-up path of the driver 710 to connect the GaN switch 160 with voltage rail $V_1$, and hence voltage rail $V_2$ needs to be at least one GaN-device-threshold above voltage rail $V_1$. In other words, the voltage rail $V_2$ creates a separate rail to help the driver 710 operate.

The $V_1$ voltage rail is fed from the $V_2$ voltage rail through an internal circuit in the driver 710. See FIGS. 15, 16 and 17 for further details.

As in the first embodiment of the temperature-adaptive gate driver shown in FIG. 5, NTC1 721, R1 731, R2 732 and the regulator 140 form a voltage control loop. The difference is that, in the third embodiment of the temperature-adaptive gate driver 100 shown in FIG. 7, the output of the regulator 140 goes to voltage rail $V_2$ which completes the loop back to voltage rail $V_1$ through the driver 710.

The rest of the operation of the third embodiment of the temperature-adaptive gate driver 100 shown in FIG. 7 is similar to the operation of the first embodiment of the temperature-adaptive gate driver shown in FIG. 5.

Figure 8:
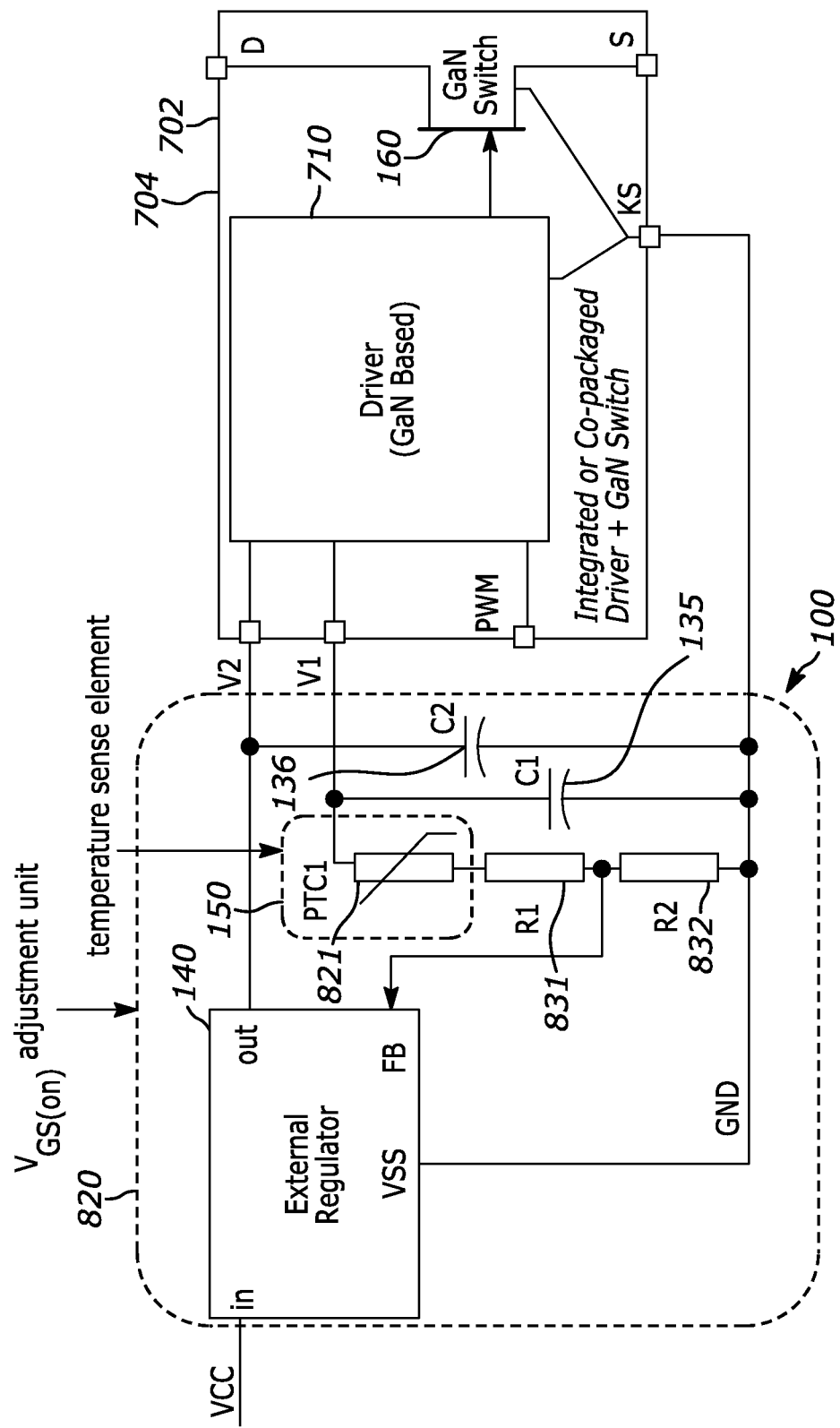
FIG. 8 is a simplified schematic of a fourth embodiment of temperature-adaptive gate driver in accordance with the invention.

FIG. 8 is a simplified schematic of a fourth embodiment of the temperature-adaptive gate driver 100 in accordance with the invention. The fourth embodiment of the temperature-adaptive gate driver 100 shown in FIG. 8 is similar to the third embodiment of the temperature-adaptive gate driver shown in FIG. 7, except that the fourth embodiment of the temperature-adaptive gate driver comprises a $V_{GS(on)}$ adjustment unit 820 that includes a temperature-adaptive gate driver 820 that uses a positive temperature coefficient device PTC1 821. The PTC1 821 acts as the temperature sense element 150. The explanation of voltage rail $V_1$ and voltage rail $V_2$ is same as in the third embodiment of the temperature-adaptive gate driver 100 shown in FIG. 7. Temperature adaption in the fourth embodiment of the temperature-adaptive gate driver 100 shown in FIG. 8 works similar to the temperature adaption explained in the description of the second embodiment of the temperature-adaptive gate driver 100 shown in FIG. 6.

Figure 9:
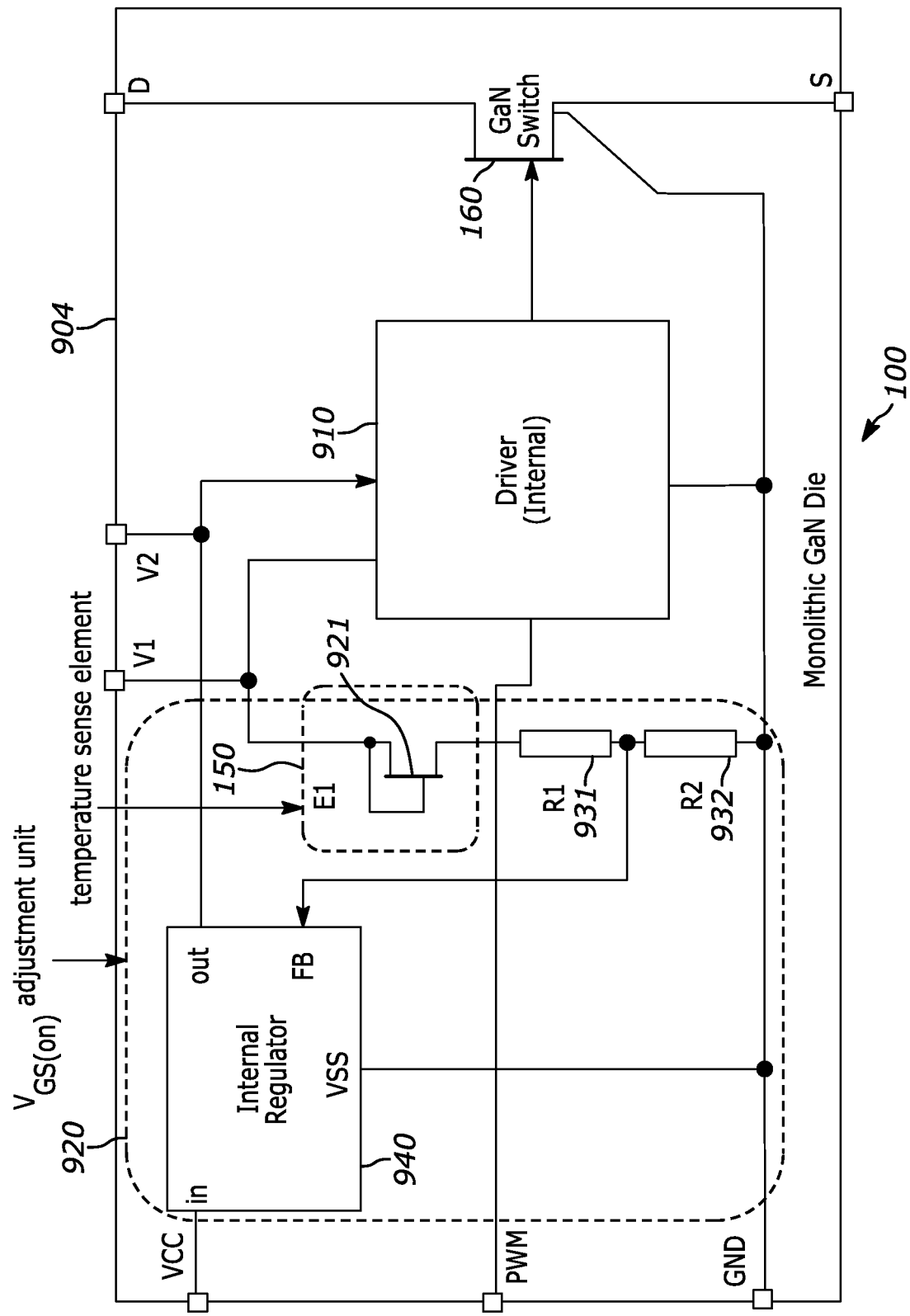
FIG. 9 is a simplified schematic of a fifth embodiment of a temperature-adaptive gate driver in accordance with the invention.

FIG. 9 is a simplified schematic of a fifth embodiment of the temperature-adaptive gate driver 100 in accordance with the invention. In this embodiment, an internal GaN driver 910, an internal GaN regulator 940 and all other GaN components of the temperature-adaptive gate driver 100 are on a same GaN die 904 as the GaN switch 160. The internal GaN regulator 940 produces voltage rail $V_2$ which goes to the internal GaN driver 910 to help it operate. A $V_1$ voltage rail sets the drive voltage of the GaN switch 160. The $V_1$ voltage rail is fed from the $V_2$ voltage rail through a circuit in the internal GaN driver 910. The fifth embodiment of the temperature-adaptive gate driver 100 comprises a $V_{GS(on)}$ adjustment unit 920 that includes a diode-connected e-mode GaN device E1 921 connected in a series configuration with a resistor R1 931 and a resistor R2 932. A voltage drop of the diode-connected e-mode GaN device E1 921 has a positive temperature coefficient. The diode-connected e-mode GaN device E1 921 functions as the temperature sense element 150. For best performance, the diode-connected e-mode GaN device E1 921 is placed in close proximity of the GaN switch 160 so that it may reflect the temperature of the GaN switch. As the temperature of the GaN switch 160 rises, a voltage drop across the temperature sense element 150 rises, and the closed loop control of the internal GaN regulator 940 forces voltage rail $V_1$ to rise, thereby achieving the objective of the fifth embodiment of the temperature-adaptive gate driver.

Figure 10:
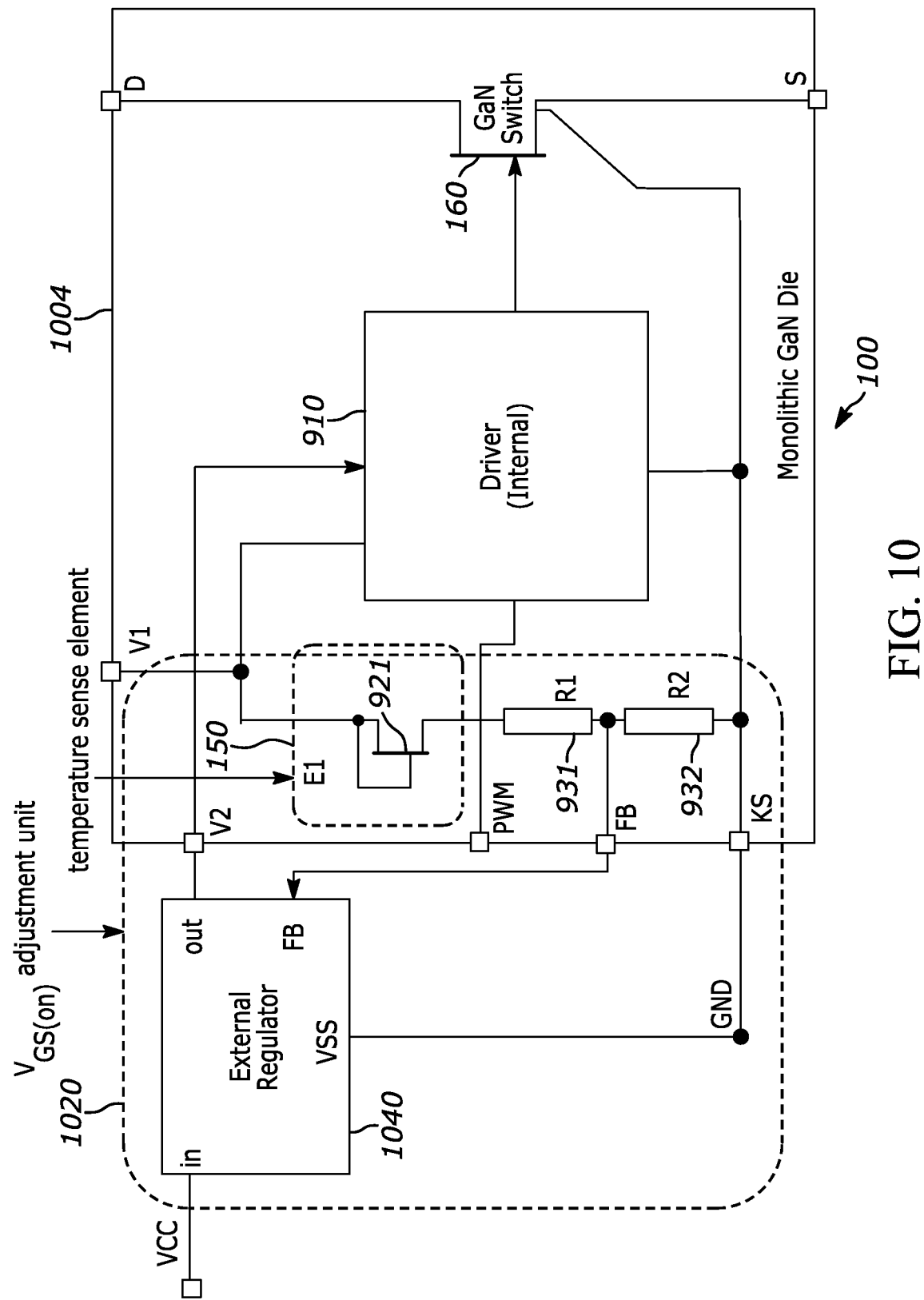
FIG. 10 is a simplified schematic of a sixth embodiment of a temperature-adaptive gate driver in accordance with the invention.

FIG. 10 is a simplified schematic of a sixth embodiment of the temperature-adaptive gate driver 100 in accordance with the invention. The sixth embodiment of the temperature-adaptive gate driver 100 is similar to the fifth embodiment of the temperature-adaptive gate driver shown in FIG. 9 except that the sixth embodiment of the temperature-adaptive gate driver 100 comprises a $V_{GS(on)}$ adjustment unit 1020 that includes an external regulator 1040 located outside a GaN die 1004. Except for the external regulator 1040, the other components of the sixth embodiment of the temperature-adaptive gate driver 100 are disposed on the GaN die 1004. In one embodiment, the external regulator 1040 and the GaN die 1004 are co-packaged in a same microelectronic package (not shown). A preferred choice for the external regulator 1040 is a silicon low-drop-out (LDO) regulator.

Figure 11:
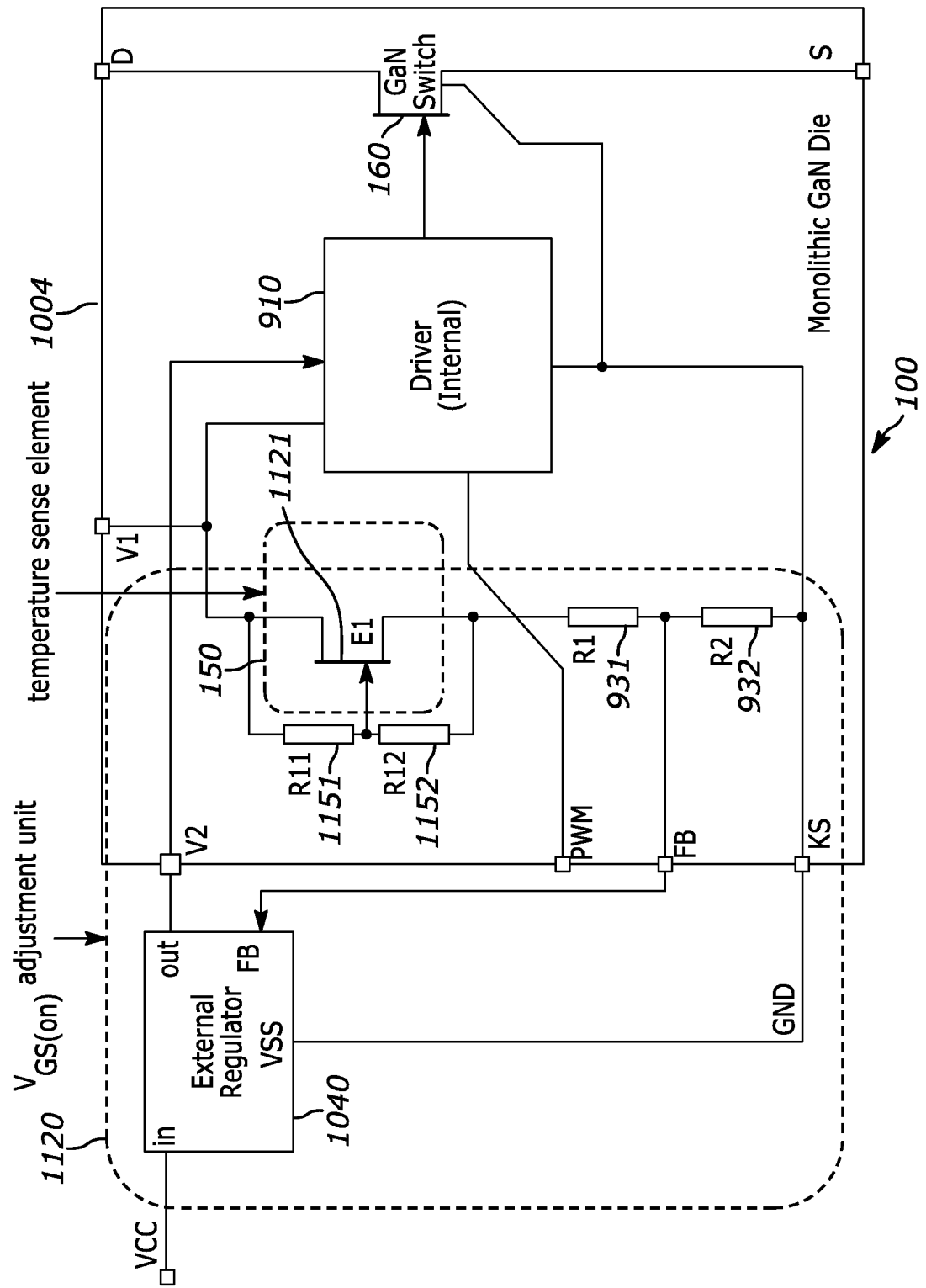
FIG. 11 is a simplified schematic of a seventh embodiment of a temperature-adaptive gate driver in accordance with the invention.

FIG. 11 is a simplified schematic of a seventh embodiment of the temperature-adaptive gate driver 100 in accordance with the invention. The seventh embodiment is similar to sixth embodiment of the temperature-adaptive gate driver 100 shown in FIG. 10 except that the seventh embodiment comprise a $V_{GS(on)}$ adjustment unit 1120 that includes a temperature sense device 150 that has a special connection.

In the seventh embodiment of the temperature-adaptive gate driver 100, the temperature sense element 150 is an e-mode GaN device 1121 having a threshold voltage of $V_{te}$. The gate of the e-mode GaN device 1121 is connected to a middle point of a resistor divider formed out of resistor R11 1151 and resistor R12 1152. This arrangement allows the e-mode GaN device 1121 to behave as a diode with a threshold of:

$$V_{te|effective} = V_{te}\frac{R12}{R12+R11}$$

Values of resistor R11 1151 and resistor R12 1152 can be adjusted to obtain a desirable effective drop across the e-mode GaN device 1121, and thereby increase relative effect of the diode-connected device in the feedback network.

Resistor R11 1151 and resistor R12 1152 are kept relatively large so that the current through the e-mode GaN device 1121 is much larger than current that flows through resistor R11 1151 and resistor R12 1152.

In other aspects, the seventh embodiment 100 is similar to the fifth and sixth embodiments of a temperature-adaptive gate driver shown in FIGS. 9 and 10 respectively.

Figure 12:
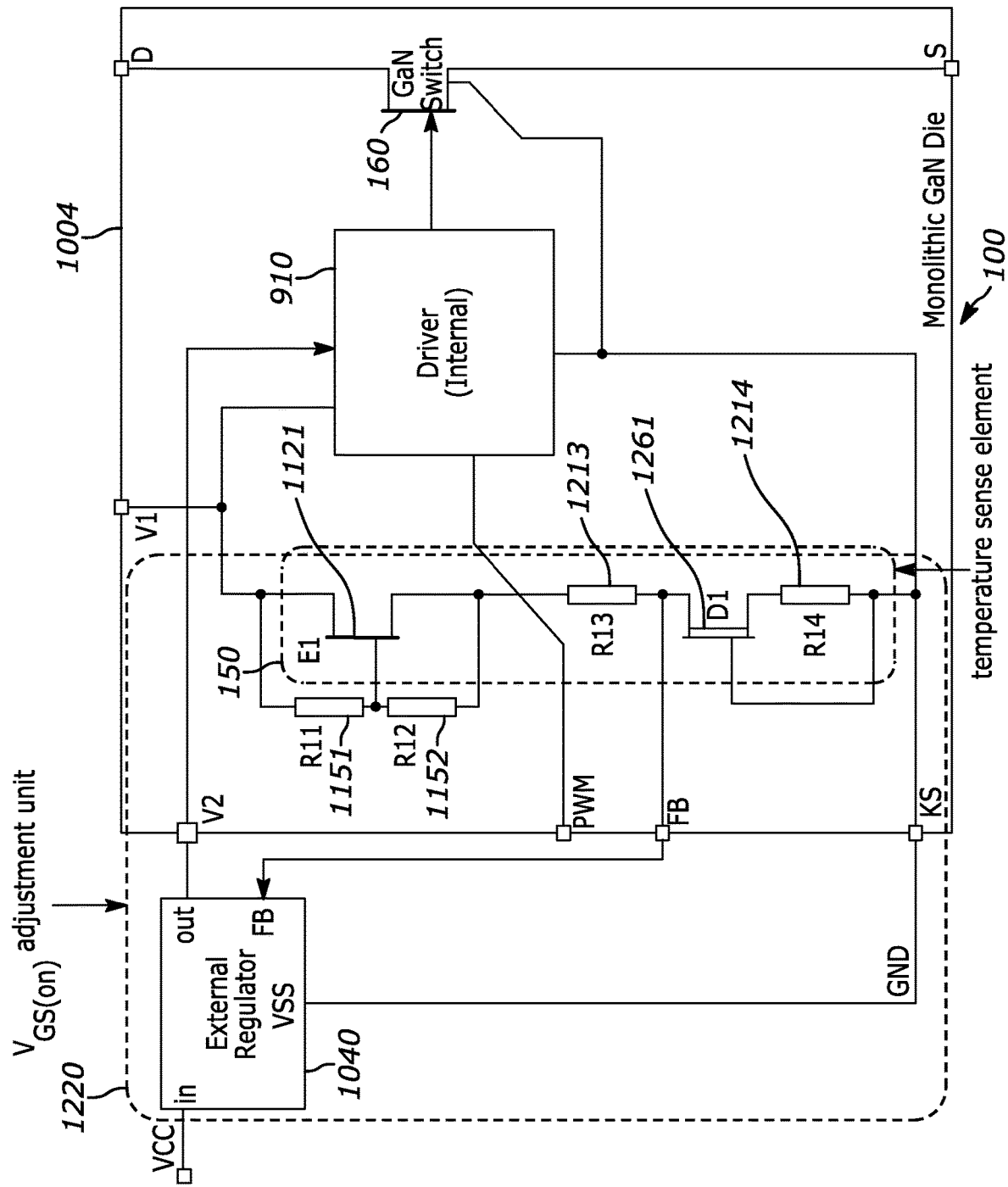
FIG. 12 is a simplified schematic of an eighth embodiment of a temperature-adaptive gate driver in accordance with the invention.

FIG. 12 is a simplified schematic of an eighth embodiment of the temperature-adaptive gate driver 100 in accordance with the invention. This embodiment is similar to the seventh embodiment of the temperature-adaptive gate driver 100 shown in FIG. 11 except for some differences in the feedback network.

The e-mode GaN device 1121 and resistors R11 1151 and R12 1152 work as explained for the seventh embodiment shown in FIG. 11. The eighth embodiment of the temperature-adaptive gate driver 100 comprises a $V_{GS(on)}$ adjustment unit 1220 that includes a d-mode device D1 1261 which has a resistor R14 1214 connected between its source and its gate. This allows the d-mode device D1 1261 to act as a current sink of value roughly close to $V_{td}/R14$, where $V_{td}$ is the absolute value of the threshold of the d-mode device D1. This current comes through resistor R13 1213 creating a voltage drop of $$V_{td}\frac{R13}{R14}.$$

The external regulator 1040 forces a voltage $V_{V1}$ at voltage rail $V_1$, as follows:

$$V_{V1} = V_{FB} + V_{td}\frac{R13}{R14} + V_{te}\frac{R12}{R12+R11},$$

where $V_{FB}$ is a voltage to which the external regulator 1040 regulates its feedback input, and usually it is a fixed voltage such as a bandgap voltage of about 1.2V. Accordingly, the voltage of voltage rail $V_1$ is a linear combination of $V_{te}$ and $V_{td}$. Typically, $V_{te}$ and $V_{td}$ are temperature dependent, and thus appropriate value of resistors R11 1151, R12 1152, R13 1213 and R14 1214 can be chosen to obtain a desirable rise in a value of voltage rail $V_1$ with rise in temperature.

Figure 13:
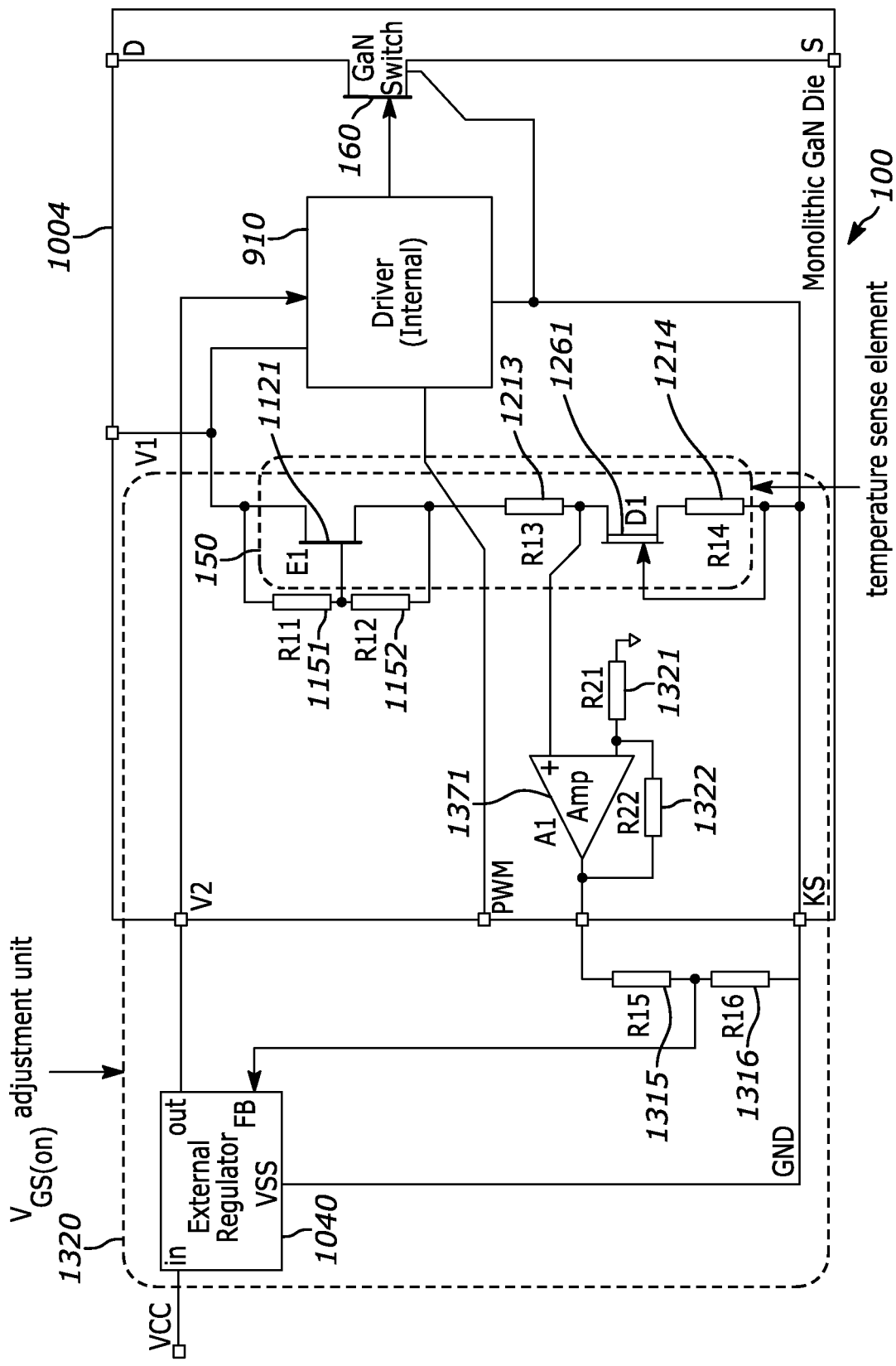
FIG. 13 is a simplified schematic of a ninth embodiment of a temperature-adaptive gate driver in accordance with the invention.

FIG. 13 is a simplified schematic of a ninth embodiment of the temperature-adaptive gate driver 100 in accordance with the invention. This is similar to the eighth embodiment shown in FIG. 12 except for some differences in the feedback network.

The ninth embodiment of the temperature-adaptive gate driver 100 comprises a $V_{GS(on)}$ adjustment unit 1320. Instead of directly taking the feedback from the junction of resistor R13 1213 and d-mode device D1 1261, a non-inverting gain stage (consisting of amplifier A1 1371, resistor R21 1321 and resistor R22 1322) is inserted in between. The $V_{GS(on)}$ adjustment unit 1320 includes an external resistor divider consisting of resistor R15 1315 and resistor R16 1316. An output of amplifier A1 1371 is connected to resistor R15 1315. A voltage at a node between resistor R15 1315 and resistor R16 1316 is used to produce a feedback signal for the external regulator 1040.

The final expression for the voltage $V_{V1}$ at voltage rail $V_1$ is as per the following equation.

$$V_{V1} = \left(\frac{R21}{R21+R22} \cdot \frac{R15+R16}{R16}\right)V_{FB} + \left(V_{td}\frac{R13}{R14} + V_{te}\frac{R12}{R12+R11}\right)$$

A benefit of the ninth embodiment of the temperature-adaptive gate driver 100 is that resistor R15 1315 and resistor R16 1316 are discrete components, and can be selected by a user for a desired temperature profile of the voltage at voltage rail $V_1$.

Figure 14:
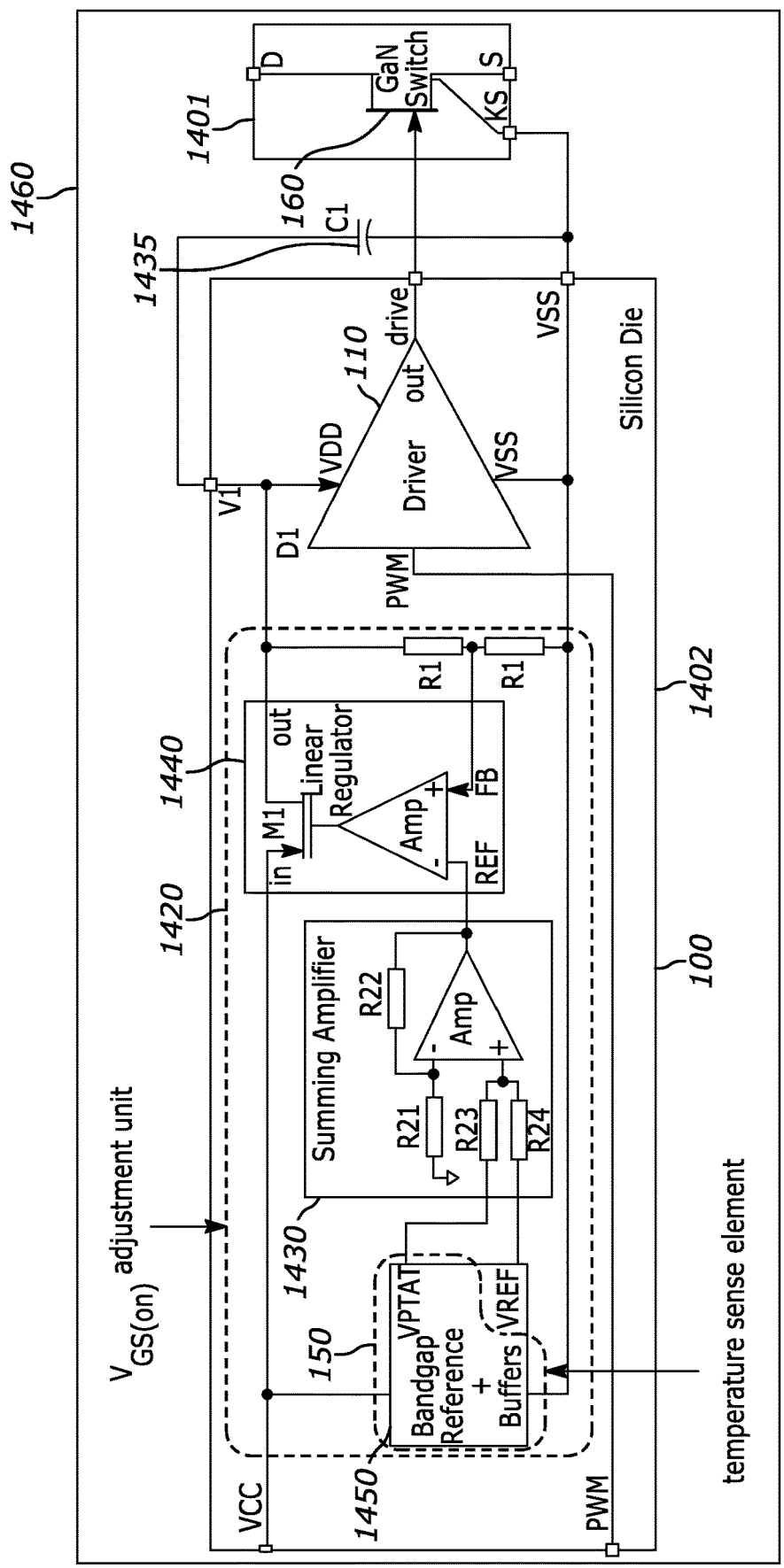
FIG. 14 is a simplified schematic of a tenth embodiment of a temperature-adaptive gate driver in accordance with the invention.

FIG. 14 is a simplified schematic of a tenth embodiment of the temperature-adaptive gate driver 100 in accordance with the invention. In this embodiment, all components of the temperature-adaptive gate driver 100 are disposed on a same silicon die 1402. More specifically, the driver 110 and the $V_{GS(on)}$ adjustment unit 1420 are disposed on the same silicon die 1402. The $V_{GS(on)}$ adjustment unit 1420 comprises a temperature sense element 150, a summing amplifier 1430 and a linear regular 1440. The temperature sense element 150 comprises a silicon bandgap reference 1450 and buffers. The GaN switch 106 is on a GaN die 1401. The GaN die 1401 and silicon die 1402 are co-packaged in a same microelectronic package 1460 with de-coupling capacitor 1435 between voltage rail $V_1$ and ground.

The bandgap circuit 1450 produces a voltage $V_{PTAT}$ that is proportional to absolute temperature. The bandgap circuit 1450 also produces a fixed reference VREF.

The summing amplifier 1430 is used to produce a linear combination of $V_{PTAT}$ and VREF which then sets a reference point of the linear regulator 1440.

The output of the linear regulator 1440 is $V_1$ which is a drive rail of the driver 110.

When in an on-state, the driver 110 produces a drive voltage that is a linear combination of $V_{PTAT}$ and a fixed voltage VREF.

Temperature sensing occurs within the silicon bandgap reference 1450 which needs to be in close proximity of the GaN switch 106 to follow its temperature. This can be achieved to a very good degree by co-packaging the GaN die 1401 and the silicon die 1402 in a single microelectronic package.

FIGS. 15, 16 and 17 illustrate of how voltage rail $V_1$ is fed from voltage rail $V_2$ to complete the loop in the embodiments shown in FIGS. 7-13. Two examples of how voltage rail $V_1$ can be fed from voltage rail $V_2$ is shown in FIGS. 16 and 17. These examples are not all the possible ways in which voltage rail $V_1$ can be fed from voltage rail $V_2$.

In FIG. 16, resistor R31 1631 and resistor R32 1632 form a resistor divider. The common point of this resistor divider is connected to the gate of an e-mode GaN device 1630. This arrangement allows the combination to work as a diode with an effective threshold scaled by a factor of $$\frac{R31+R32}{R32}.$$

By adjusting the resistor ratios, one could obtain a larger voltage drop between voltage rail $V_2$ and voltage rail $V_1$ which may be used for further improvement of the performance of the GaN driver 910. For good performance, values of resistor R31 1631 and resistor R32 1632 are kept fairly high so that the voltage drop is determined by the threshold voltage of the e-mode GaN device 1630 and not by the absolute values of the resistors.

In FIG. 17, an e-mode GaN device 1730 is connected in a diode-like fashion, i.e., gate connected to drain, with a positive side on voltage rail $V_2$ and the negative side on voltage rail $V_1$. This provides a direct current path from voltage rail $V_2$ to voltage rail $V_1$. As voltage rail $V_2$ voltage rises, it pulls up voltage rail $V_1$ with a voltage drop that depends on a current demand on voltage rail $V_1$. Under normal operation, voltage rail $V_1$ has a small non-zero current demand from circuits (not shown) within the driver 910, and therefore the voltage drop is always more than a threshold voltage of the e-mode GaN device 1730. This way, voltage rail $V_2$ is able to maintain a voltage which is always at least one threshold voltage above voltage rail $V_1$, and together the two voltage rails allow the GaN driver 910 to function properly.

The gate-to-source voltage adjustment unit changes the on-state gate-to-source voltage according to a pre-determined scheme in response to the output signal of the temperature sense element. In the embodiments shown in FIGS. 5-8 and 13, where the feedback network of the regulator is available to a user, the user can advantageously configure the amount of compensation in the voltage, thereby programming a temperature versus $V_{GS(on)}$ profile which allows the user to trade-off between performance and the lifetime. The user may also choose to vary the temperature versus $V_{GS(on)}$ profile based on such factors as amount of load (e.g., full load, half load, light or no load), duty cycle of the switching converters, package type, etc.

The temperature-adaptive gate driver in accordance with the invention is amenable to implementation at various levels of monolithic-integration, multi-die co-packaging, multi-die module-level integration, and multi-component board-level solutions.

In integrated solutions, temperature sensing of switches is often done for protection purposes. In such cases for a GaN switch, the same physical unit that senses temperature for protection purpose can be utilized for implementing the temperature-adaptive gate driver 100 in accordance with the invention.

Due to the incompatibility of the gate drive voltage of an e-GaN switch and a silicon based MOSFET switch, the drive voltage of commonly available silicon MOSFET is not directly usable for e-GaN switches. Therefore, in the driver of an e-GaN switch, a regulator (not shown) is usually employed to adjust the voltage to a level suitable for the e-GaN switch. This same regulator can be used to implement the temperature-adaptive gate driver 100 by modifying the feedback network appropriately.

With the temperature-adaptive gate driver 100, adaptive control of the on-state gate-to-source voltage $V_{GS(on)}$ of a GaN device is advantageously in response to the device temperature as opposed to a fixed gate-to-source voltage that is disadvantageous employed in known methods and circuits.

Advantageously, the temperature-adaptive gate driver 100 improves $R_{DS(on)}$ and $I_{Dsat}$ without compromising the gate reliability of the GaN switch 106.

The temperature-adaptive gate driver 100 can be implemented using monolithic integration, co-packaged integration, a module-based solution, and a multi-component board-level solution.

Although not always shown in the drawings, all voltage rails ($V_{CC}$ and $V_1$ in embodiments 1-4 and 10) and ($V_{CC}$, $V_1$ and $V_2$ in embodiments 5-9) are typically provided with de-coupling capacitors to ground.

Some features of the present invention may be used in an embodiment thereof without use of other features of the present invention. As such, the foregoing description should be considered as merely illustrative of the principles, teachings, examples, and exemplary embodiments of the present invention, and not a limitation thereof.

These embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of a design of an IC. The design of the IC is created in a graphical computer programming language, and stored in a computer storage medium (such as a disk, tape, physical hard drive, or virtual hard drive such as in a storage access network). If a designer does not fabricate chips or photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above are used in fabrication of ICs. The resulting ICs can be distributed by the fabricator in raw wafer form (that is, as a single wafer that has multiple unpackaged chips), as a bare chip, or in a packaged form. In the latter case, the IC is mounted in a single chip package or in a multichip package. In any case, the IC is then coupled to other ICs, discrete circuit elements, and/or other signal processing devices as part of either (a) an intermediate product, such as a motherboard, or (b) an end product. The end product can be any product that includes ICs, ranging from toys and other low-end applications to advanced computer products (such as, but not limited to, an information processing system) having a display, a keyboard, or other input device, and a central processor.

Unless stated otherwise, terms such as "first" and "second" are used to arbitrarily distinguish between the elements that such terms describe. Thus, these terms are not necessarily intended to indicate temporal or other prioritization of such elements.

The terms "a" or "an", as used herein, are defined as one as or more than one. The term plurality, as used herein, is defined as two as or more than two. Plural and singular terms are the same unless expressly stated otherwise. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A temperature-adaptive gate driver for a GaN switch, comprising:
   a GaN switch disposed on a GaN substrate;
   a driver disposed on another substrate for outputting an on-state gate-to-source voltage to a gate terminal of the GaN switch;
   a gate-to-source voltage adjustment unit, disposed on the other substrate, for outputting an output signal to the driver,
   wherein the gate-to-source voltage adjustment unit includes a temperature sense element for sensing temperature of the GaN switch; and
   wherein the on-state gate-to-source voltage is adjustable based, in part, on the temperature of the GaN switch.

2. The temperature-adaptive gate driver for a GaN switch of claim 1, wherein the temperature sense element is located near the GaN switch so that a temperature of the temperature sense element reflects the temperature of the GaN switch.

3. The temperature-adaptive gate driver for a GaN switch of claim 1, wherein the gate-to-source voltage adjustment unit includes a resistor network coupled to the temperature sense element.

4. The temperature-adaptive gate driver for a GaN switch of claim 3, wherein the gate-to-source voltage adjustment unit includes a regulator for receiving a feedback signal from the resistor network, the feedback signal based in part, on resistance of the temperature sense element, and for causing a value of the output signal to be responsive to a value of the feedback signal.

5. The temperature-adaptive gate driver for a GaN switch of claim 1, wherein the output signal outputted by the gate-to-source voltage adjustment unit to the driver is responsive to a temperature of the temperature sense element.

6. The temperature-adaptive gate driver for a GaN switch of claim 5, wherein the output signal that the gate-to-source voltage adjustment unit outputs to the driver is one of: a temperature-dependent voltage and a temperature-dependent current.

7. The temperature-adaptive gate driver for a GaN switch of claim 1, wherein the on-state gate-to-source voltage of the GaN switch rises with a rise in temperature of the GaN switch in a pre-determined fashion.

8. The temperature-adaptive gate driver for a GaN switch of claim 7, wherein an amount of adjustment in the on-state gate-to-source voltage of the GaN switch with rise in temperature is based, in part, on high-temperature gate-bias reliability data of the GaN switch.

9. The temperature-adaptive gate driver for a GaN switch of claim 1, wherein the gate-to-source voltage adjustment unit changes the on-state gate-to-source voltage according to a pre-determined scheme in response to the output signal of the temperature sense element.

10. The temperature-adaptive gate driver for a GaN switch of claim 9, wherein a temperature versus $V_{GS(on)}$ profile of the gate-to-source voltage adjustment unit is programmable by a user to allow for a trade-off between performance and life-time.

11. The temperature-adaptive gate driver for a GaN switch of claim 10, wherein the temperature versus $V_{GS(on)}$ profile of the gate-to-source voltage adjustment unit can be varied by a user based on one or both of: amount of load, and package type.

12. The temperature-adaptive gate driver for a GaN switch of claim 1, wherein the driver is a silicon-based driver having a first terminal for receiving a pulse width modulated signal, a second terminal for receiving the output signal from the gate-to-source voltage adjustment unit, a third terminal coupled to ground, and an output terminal coupled to the gate terminal of the GaN switch.

13. The temperature-adaptive gate driver for a GaN switch of claim 1, wherein the driver is a GaN-based driver having first terminal for receiving a pulse width modulated signal, a second terminal for receiving the output signal from the gate-to-source voltage adjustment unit, a third terminal coupled to ground, an output terminal for outputting a lower voltage to the gate-to-source voltage adjustment unit, and an output terminal coupled to the gate terminal of the GaN switch.

14. The temperature-adaptive gate driver for a GaN switch of claim 1, wherein the other substrate is a silicon substrate.

15. A circuit, comprising:
   a GaN substrate;
   a GaN switch disposed on the GaN substrate, the GaN switch including a gate terminal;
   a driver disposed on another substrate, the driver for outputting an on-state gate-to-source voltage to the gate terminal; and
   a GaN gate-to-source voltage adjustment unit disposed on the other substrate, the GaN gate-to-source voltage adjustment unit for outputting an output signal to the GaN driver, wherein GaN gate-to-source voltage adjustment unit includes a temperature sense element for sensing temperature of the GaN switch,
   wherein the on-state gate-to-source voltage is based, in part, on the temperature of the GaN switch.

16. The circuit of claim 15, wherein the temperature sense element comprises an E-mode GaN device coupled to a resistor network.

17. The circuit of claim 16, wherein the GaN gate-to-source voltage adjustment unit includes a GaN regulator for receiving a feedback signal from the resistor network, the feedback signal based in part, on resistance of the temperature sense element, and for causing a value of the output signal to be responsive to a value of the feedback signal.

18. The circuit of claim 15, wherein the other substrate is another GaN substrate.

19. A microelectronic package, comprising:
   a first GaN substrate in the microelectronic package;
   a GaN switch disposed on the first GaN substrate, the GaN switch including a gate terminal;
   a second substrate in the microelectronic package;
   a driver disposed on the second substrate, the driver for outputting an on-state gate-to-source voltage to the gate terminal, wherein the on-state gate-to-source voltage is based, in part, on temperature of the GaN switch; and
   a gate-to-source voltage adjustment unit disposed on the second substrate, the gate-to-source voltage adjustment unit for outputting an output signal to the driver, wherein the gate-to-source voltage adjustment unit includes:
      a temperature sense element for sensing temperature of the GaN switch,
      a resistor network coupled to the temperature sense element, and a regulator for receiving a feedback signal from the resistor network, the feedback signal based in part, on resistance of the temperature sense element, and for causing a value of the output signal to be responsive to a value of the feedback signal.

* * * * *